US011652064B2

(12) United States Patent
Kim et al.

(10) Patent No.: US 11,652,064 B2
(45) Date of Patent: May 16, 2023

(54) INTEGRATED DEVICE WITH ELECTROMAGNETIC SHIELD

(71) Applicant: QUALCOMM Incorporated, San Diego, CA (US)

(72) Inventors: Jonghae Kim, San Diego, CA (US); Je-Hsiung Lan, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 157 days.

(21) Appl. No.: 16/706,167

(22) Filed: Dec. 6, 2019

(65) Prior Publication Data

US 2021/0175181 A1   Jun. 10, 2021

(51) Int. Cl.
 *H01L 23/552* (2006.01)
 *H01L 23/00* (2006.01)
 *H01L 25/16* (2006.01)

(52) U.S. Cl.
 CPC ............ *H01L 23/552* (2013.01); *H01L 24/08* (2013.01); *H01L 24/80* (2013.01); *H01L 25/16* (2013.01); *H01L 2224/08145* (2013.01); *H01L 2224/80895* (2013.01); *H01L 2224/80896* (2013.01); *H01L 2924/19042* (2013.01); *H01L 2924/19104* (2013.01); *H01L 2924/3025* (2013.01)

(58) Field of Classification Search
 CPC ....... H01L 23/522; H01L 25/16; H01L 24/08; H01L 24/80; H01L 23/00; H01L 2224/80896; H01L 2924/19042; H01L 2924/19104; H01L 2224/09145; H01L 2224/80895; H01L 2924/3025

USPC .......................................................... 257/659
See application file for complete search history.

(56) References Cited

U.S. PATENT DOCUMENTS

| 10,950,599 | B1 * | 3/2021 | Or-Bach ................... G06F 1/20 |
| 2007/0108582 | A1 * | 5/2007 | Karnezos ............ H01L 23/3128 257/686 |
| 2008/0227238 | A1 * | 9/2008 | Ko ........................ H01L 23/552 438/108 |

(Continued)

FOREIGN PATENT DOCUMENTS

| CN | 11047826 | A | * | 7/2019 | ........... H01L 23/552 |
| CN | 110010503 | A | * | 7/2019 | ............. H01L 23/58 |
| CN | 107768349 | B | * | 11/2019 | ........... H01L 23/552 |

OTHER PUBLICATIONS

International Search Report and Written Opinion—PCT/US2020/057830—ISA/EPO—dated Feb. 1, 2021.

*Primary Examiner* — Alexander O Williams
(74) *Attorney, Agent, or Firm* — Muncy, Geissler, Olds & Lowe PC

(57) ABSTRACT

Improve EM coupling for the wafer-bonding process from a first wafer to a second wafer by a shielding technique. Examples may include building an EM shield implemented by BEOL-stacks/routings, bonding contacts, and TSVs for a closed-loop shielding platform for the integrated device to minimize EM interference from active devices due to eddy currents. The shield may be implemented in the active device layer during a wafer-to-wafer bonding-process that uses two different device layers/wafers, an active device layer/wafer and a passive device layer/wayer. The shield may be designed by the patterned routings for both I/O ports and the GND contacts.

19 Claims, 9 Drawing Sheets

(56) References Cited

U.S. PATENT DOCUMENTS

| | | | |
|---|---|---|---|
| 2008/0315374 A1* | 12/2008 | Kim | H01L 23/3121 |
| | | | 257/659 |
| 2009/0309197 A1* | 12/2009 | Chow | H01L 23/3128 |
| | | | 257/659 |
| 2010/0078777 A1 | 4/2010 | Barth et al. | |
| 2010/0078778 A1 | 4/2010 | Barth et al. | |
| 2010/0078779 A1* | 4/2010 | Barth | H01L 23/552 |
| | | | 257/659 |
| 2018/0012868 A1 | 1/2018 | Huang et al. | |
| 2018/0323170 A1* | 11/2018 | Kim | H01L 23/3128 |
| 2019/0074267 A1 | 3/2019 | Yang et al. | |
| 2019/0103365 A1* | 4/2019 | Singh | H01L 25/16 |
| 2019/0279968 A1* | 9/2019 | Hsu | H01L 23/3128 |
| 2019/0385989 A1* | 12/2019 | Yu | H01L 23/5386 |
| 2020/0035625 A1* | 1/2020 | Wang | H01Q 21/062 |
| 2020/0286839 A1* | 9/2020 | Jang | H01L 23/3675 |
| 2021/0375829 A1* | 12/2021 | Or-Bach | H01L 23/66 |

* cited by examiner

INTEGRATED DEVICE WITH ELECTROMAGNETIC SHIELD

FIELD OF DISCLOSURE

This disclosure relates generally to integrated devices, and more specifically, but not exclusively, to integrated devices with an electromagnetic (EM) shield.

BACKGROUND

As electronic devices increase functionality while striving to maintain a small form factor, the need for more integrated devices becomes important. For example, integrating a passive device and an active device into a single package helps achieve greater integration while reducing the form factor of the integrated device compared to two separate devices. One conventional approach uses a side by side configuration of the two devices on a common substrate. However, the lateral size of the integrated device still causes issues. Another conventional approach uses a vertical configuration of one device on top of another device on a common substrate. However, the vertical integration causes issues with EM interference between an active device under a passive device, for example.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an integrated device comprises: a first device layer comprising an active device and a first device bonding layer; a second device layer comprising a passive device and a second device bonding layer, the second device layer attached to the first device bonding layer; and a shield comprising a plurality of bonding contacts in a first plane of the first device bonding layer, a plurality of bonding layer contact in a second plane parallel to the first plane, a plurality of bonding layer interconnects in the second plane, a plurality of vias in a third plane parallel to the second plane opposite the first plane, and a plurality of end of line interconnects in a fourth plane parallel to the third plane opposite the second plane, wherein the plurality of bonding layer interconnects couple at least one of the plurality of bonding layer interconnects to at least another one of the plurality of bonding layer interconnects and the plurality of end of line interconnects couple at least one of the plurality of vias to at least another one of the plurality of vias.

In another aspect, an integrated device comprises: a first device layer comprising an active device and a first device bonding layer; a second device layer comprising a passive device and a second device bonding layer, the second device layer attached to the first device bonding layer; and means for shielding electromagnetic (EM) waves, the means for shielding EM waves surrounding the active device comprising a plurality of bonding contacts in a first plane of the first device bonding layer, a plurality of bonding layer contact in a second plane parallel to the first plane, a plurality of bonding layer interconnects in the second plane, a plurality of vias in a third plane parallel to the second plane opposite the first plane, and a plurality of end of line interconnects in a fourth plane parallel to the third plane opposite the second plane, wherein the plurality of bonding layer interconnects couple at least one of the plurality of bonding layer interconnects to at least another one of the plurality of bonding layer interconnects and the plurality of end of line interconnects couple at least one of the plurality of vias to at least another one of the plurality of vias.

In still another aspect, a method for manufacturing an integrated device comprises: forming a first device substrate; forming an active device in the first device substrate; forming a shield around the active device; forming a first device bonding layer on a first side of the first device substrate; forming a second device substrate; forming a passive device in the second device substrate; forming a second device bonding layer on a first side of the second device substrate; and bonding the first device bonding layer to the second device bonding layer.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
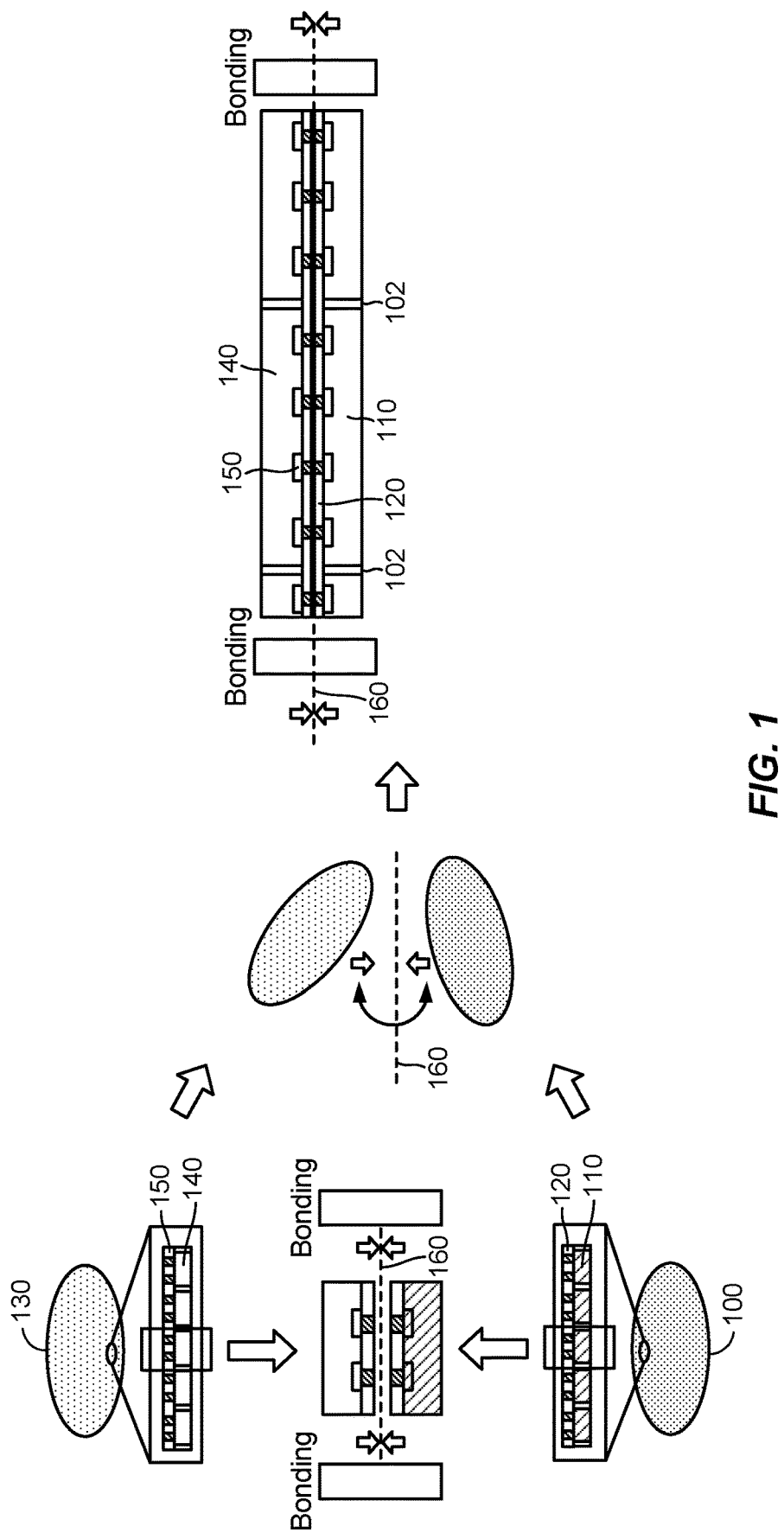
FIG. 1 illustrates an exemplary bonding process for an integrated device in accordance with some examples of the disclosure.

In accordance with common practice, the features depicted by the drawings may not be drawn to scale.

Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs.

FIG. 1 illustrates an exemplary bonding process for an integrated device in accordance with some examples of the disclosure. As shown in FIG. 1, a bonding process for an integrated device may comprise a first wafer 100 comprising a plurality of first devices (e.g., active devices such as transistors) in a first device layer 110 and a first device bonding layer 120 and a second wafer 130 comprising a plurality of second devices (e.g., passive devices such as transformers and inductors) in a second device layer 140 and a second device bonding layer 150. The first wafer 100 and the second wafer 130 are mated together such that the first device bonding layer 120 aligns with the second device bonding layer 150 to bond the first wafer 100 and the second wafer 130. The bonded wafers may then be singulated along singulation lines 102 to form individual integrated devices wherein each device includes the first device layer 110, first device bonding layer 120, second device layer 140, and the second device bonding layer 150. The individual integrated devices may also include additional routing, ground contacts, and input/output (I/O) pins for external communication.

Figure 2:
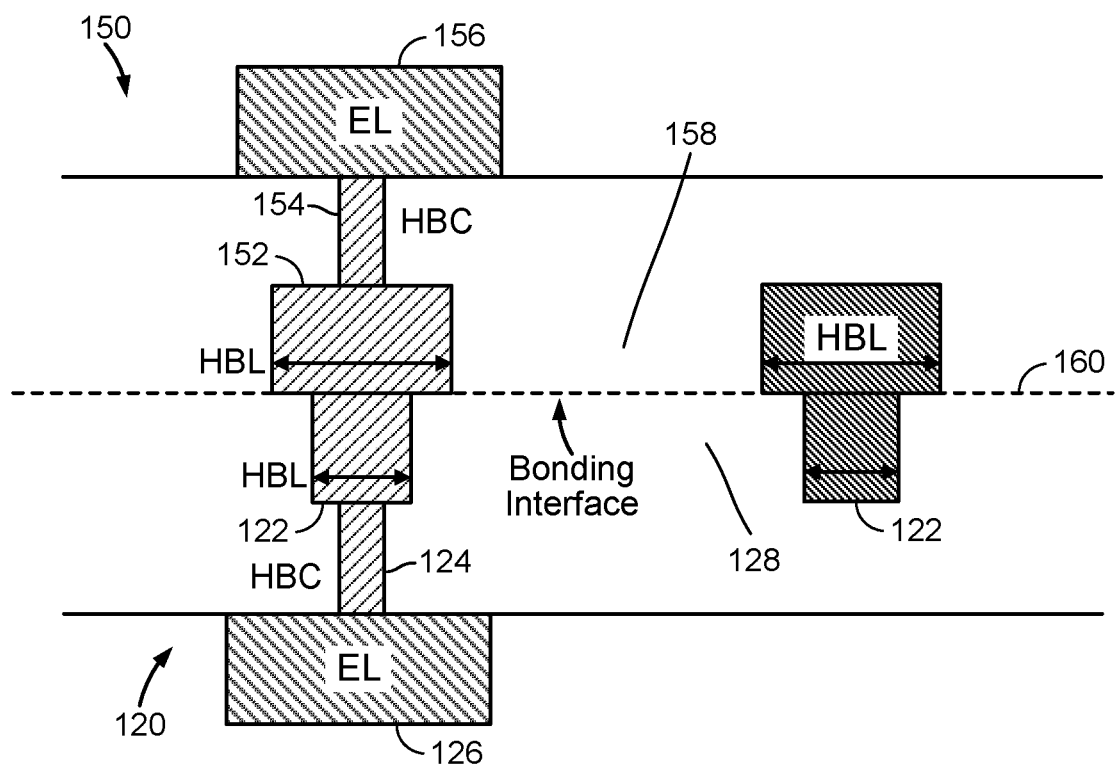
FIG. 2 illustrates an exemplary bonding interface for an integrated device in accordance with some examples of the disclosure.

FIG. 2 illustrates an exemplary bonding interface for an integrated device in accordance with some examples of the disclosure. As shown in FIG. 2, the bonding interface 160 is where the first device bonding layer 120 mates with the second device bonding layer 150. As shown, the first device bonding layer 120 may include a plurality of bonding contacts 122, a plurality of bonding layer contacts 124 (only one shown), and a plurality of end of line (EL) contacts 126 (only one shown) in a first bonding layer material 128. Similarly, the second device bonding layer 150 may include a plurality of bonding contacts 152, a plurality of bonding layer contacts 154 (only one shown), and a plurality of end of line (EL) contacts 156 (only one shown) in a second bonding layer material 158. The structure may be symmetrical about the bonding interface 160 or may be asymmetrical as shown.

Figure 3:
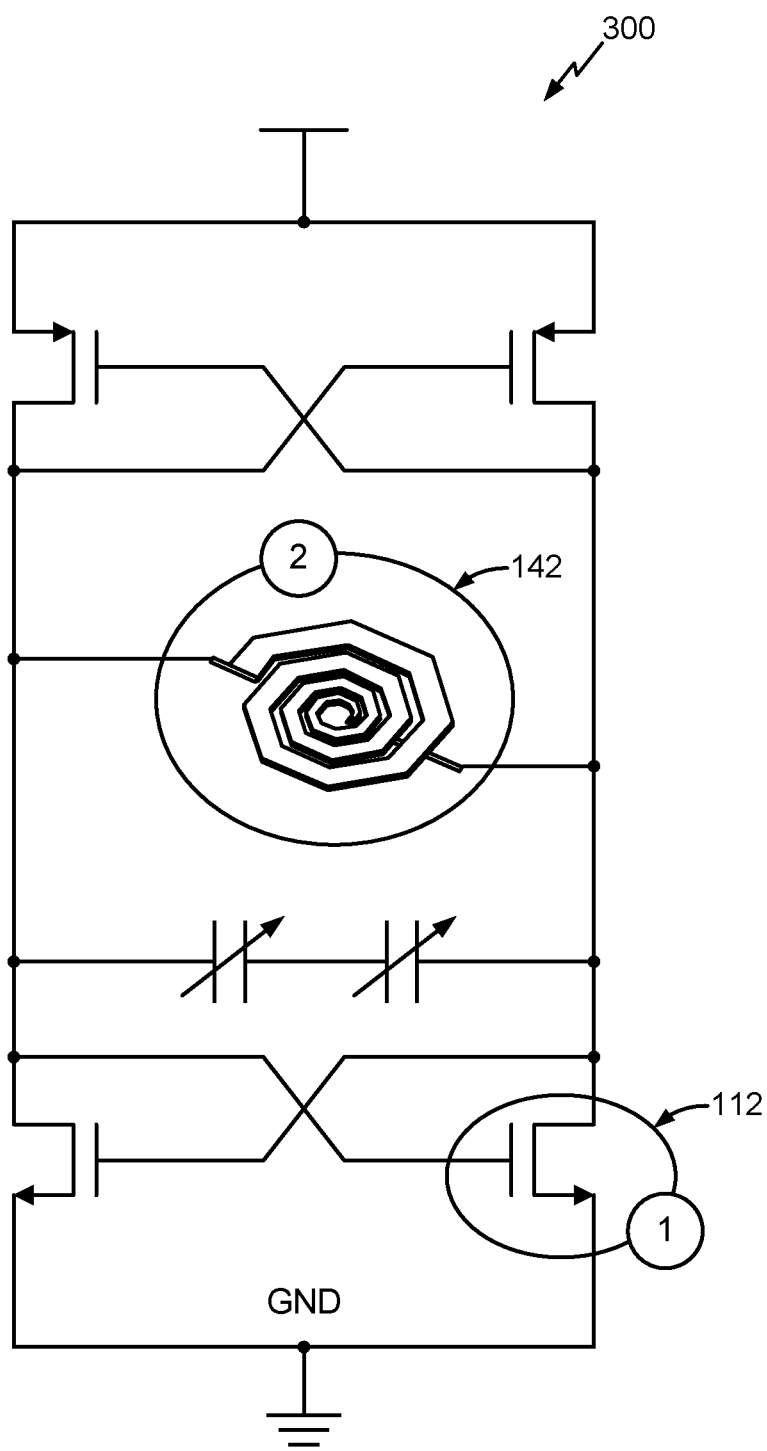
FIG. 3 illustrates an exemplary VCO circuit for an integrated device in accordance with some examples of the disclosure.

FIG. 3 illustrates an exemplary VCO circuit for an integrated device in accordance with some examples of the disclosure. As shown in FIG. 3, an example circuit 300 may include at least one integrated device comprising a first device 112 (e.g., a transistor) in the first device layer 110 (not shown) and a second device 142 (e.g., an inductor) in the second device layer 140 (not shown).

Figure 4:
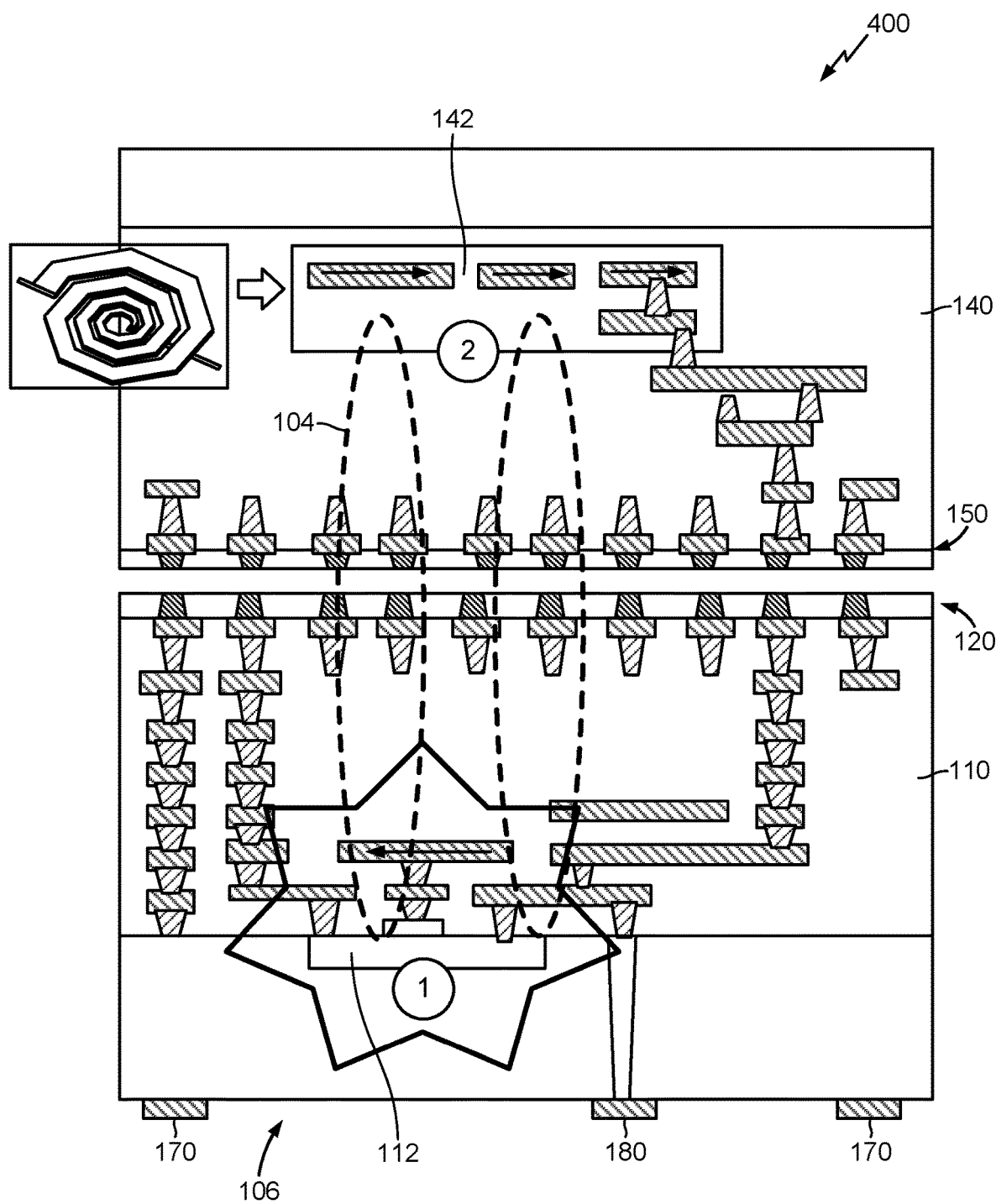
FIG. 4 illustrates an exemplary integrated device in accordance with some examples of the disclosure.

FIG. 4 illustrates an exemplary integrated device in accordance with some examples of the disclosure. As shown in FIG. 4, an integrated device 400 may include a first device 112, a plurality of ground contacts 170 and a plurality of I/O pins 180 (only one shown) on a first side 106 of the first device layer 110. The integrated device 400 creates magnetic fields 104 during operation of an active device such as the first device 112. These magnetic fields may interfere with a passive device such as the second device 142. To reduce or eliminate the interference, the integrated device 400 may use a shield 190 comprising a configuration of the contacts, vias, and routing in the first device layer 110 that surrounds the first device 112 to shield the second device 142 from electromagnetic interference from the first device 112.

Figure 5:
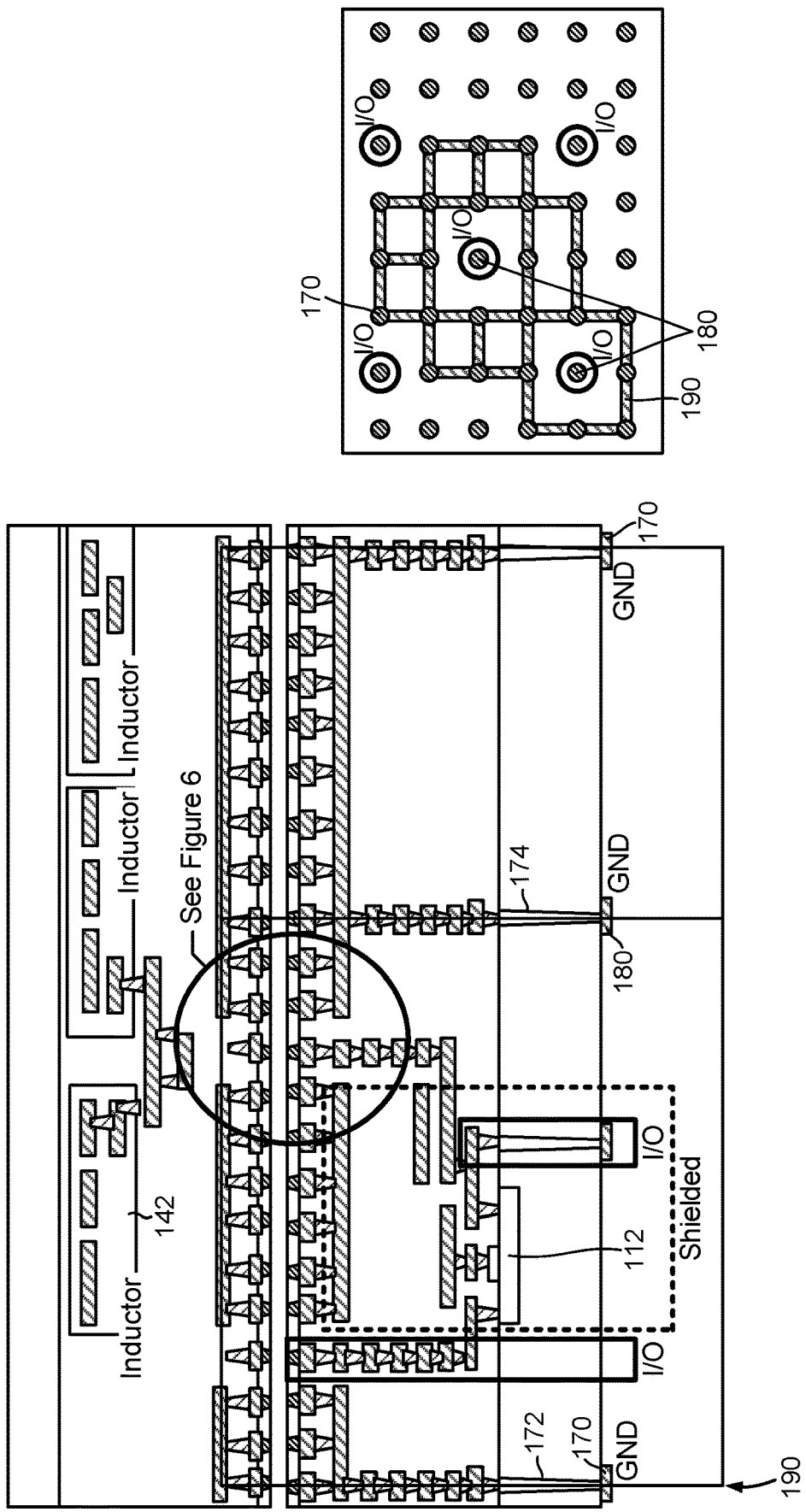
FIG. 5 illustrates an exemplary integrated device with a plan view in accordance with some examples of the disclosure.

FIG. 5 illustrates an exemplary integrated device with a plan view in accordance with some examples of the disclosure. As shown in FIG. 5, an integrated device 500 may include a shield 190 around the first device 112 to shield the second device 142 from electromagnetic interference from the first device 112. The shield 190 may comprise one of the plurality of ground contacts 170, a first via 172, the first device bonding layer 120, a second via 174, and another one of the plurality of ground contacts 170 surrounding the first device 112 as well as I/O pins 180. As can be seen in the plan view of FIG. 5, the shield 190 also surround at least one of the I/O pins 180 to shield the I/O pins 180 as well as the second device 142 from EM interference produced by the first device 112.

Figure 6:
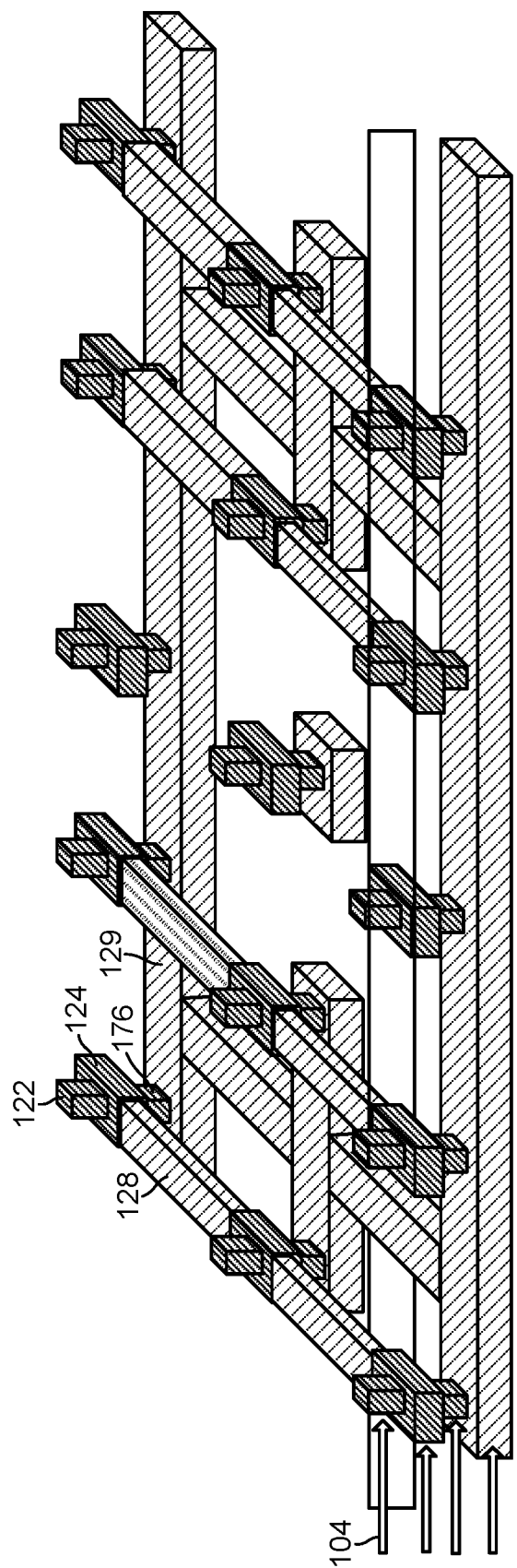
FIG. 6 illustrates an exemplary shield an integrated device in accordance with some examples of the disclosure.

FIG. 6 illustrates an exemplary shield an integrated device in accordance with some examples of the disclosure. As shown in FIG. 6, a portion of shield 190 in the first device bonding layer 120. The shield 190 may include a plurality of bonding contacts 122, a plurality of bonding layer contacts 124, a plurality of vias 176, a plurality of bonding layer interconnects 128 selectively coupled between some of the plurality of bonding layer contacts 124, and a plurality of EL interconnects 129 selectively coupled to some of the plurality of vias 176 such that the EM field 104 may be coupled to the shield 190 and grounded by the plurality of ground contacts 170 (not shown).

Figure 7:
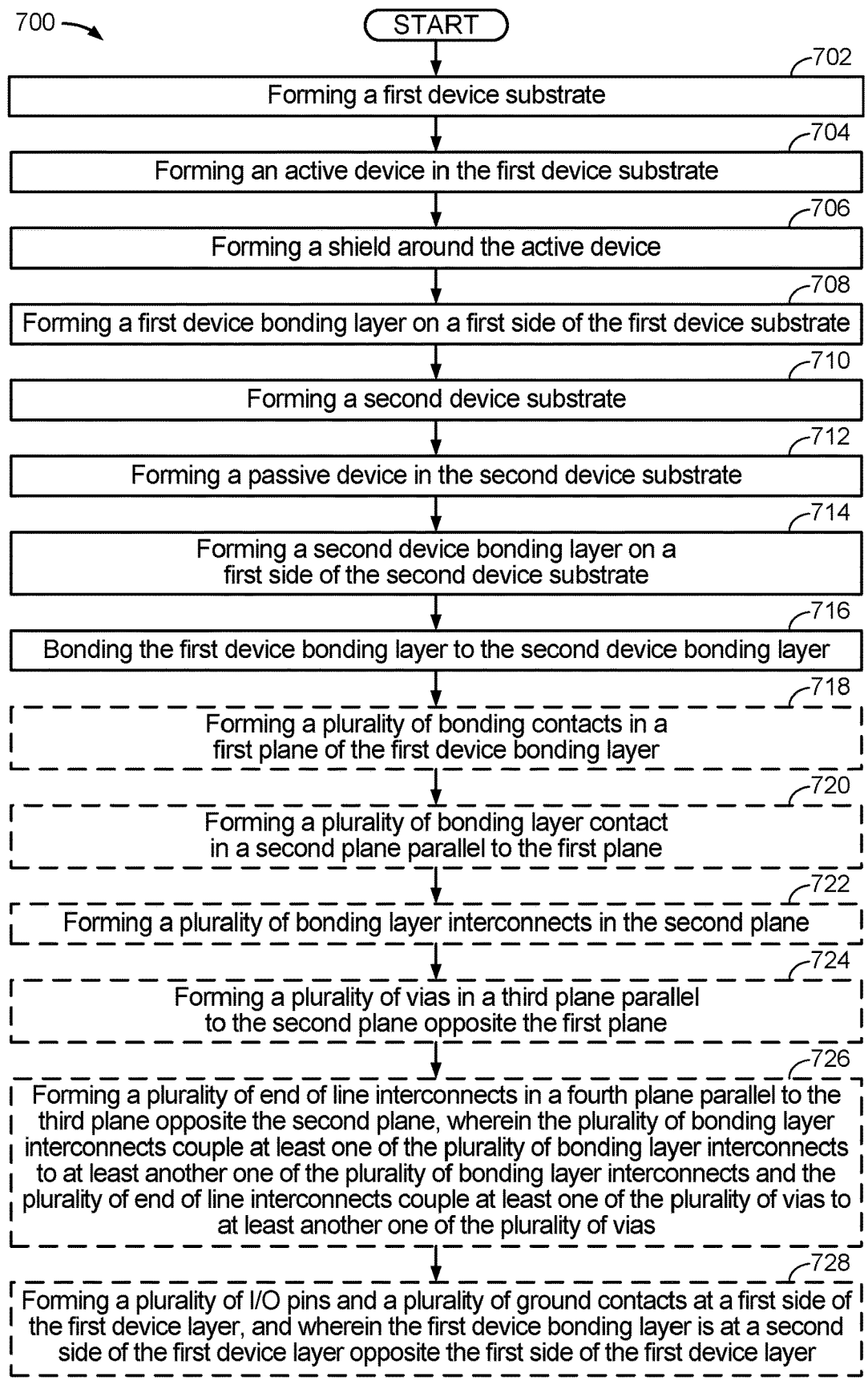
FIG. 7 illustrates an exemplary partial method for manufacturing an integrated device in accordance with some examples of the disclosure.

FIG. 7 illustrates an exemplary partial method for manufacturing an integrated device in accordance with some examples of the disclosure. As shown in FIG. 7, a partial method 700 may being in block 702 with forming a first device substrate. The partial method 700 may continue in block 704 with forming an active device in the first device substrate. The partial method 700 may continue in block 706 with forming a shield around the active device. The partial method 700 may continue in block 708 with forming a first device bonding layer on a first side of the first device substrate. The partial method 700 may continue in block 710 with forming a second device substrate. The partial method 700 may continue in block 712 with forming a passive device in the second device substrate. The partial method 700 may continue in block 714 with forming a second device bonding layer on a first side of the second device substrate. The partial method 700 may conclude in block 716 with bonding the first device bonding layer to the second device bonding layer.

The partial method 700 may alternatively continue in block 718 with forming a plurality of bonding contacts in a first plane of the first device bonding layer. The partial method 700 may alternatively continue in block 720 with forming a plurality of bonding layer contact in a second plane parallel to the first plane. The partial method 700 may alternatively continue in block 722 with forming a plurality of bonding layer interconnects in the second plane. The partial method 700 may alternatively continue in block 724 with forming a plurality of vias in a third plane parallel to the second plane opposite the first plane. The partial method 700 may alternatively continue in block 726 with forming a plurality of end of line interconnects in a fourth plane parallel to the third plane opposite the second plane, wherein the plurality of bonding layer interconnects couple at least one of the plurality of bonding layer interconnects to at least another one of the plurality of bonding layer interconnects and the plurality of end of line interconnects couple at least one of the plurality of vias to at least another one of the plurality of vias. The partial method 700 may alternatively continue in block 728 with forming a plurality of I/O pins and a plurality of ground contacts at a first side of the first device layer, and wherein the first device bonding layer is at a second side of the first device layer opposite the first side of the first device layer.

Figure 8:
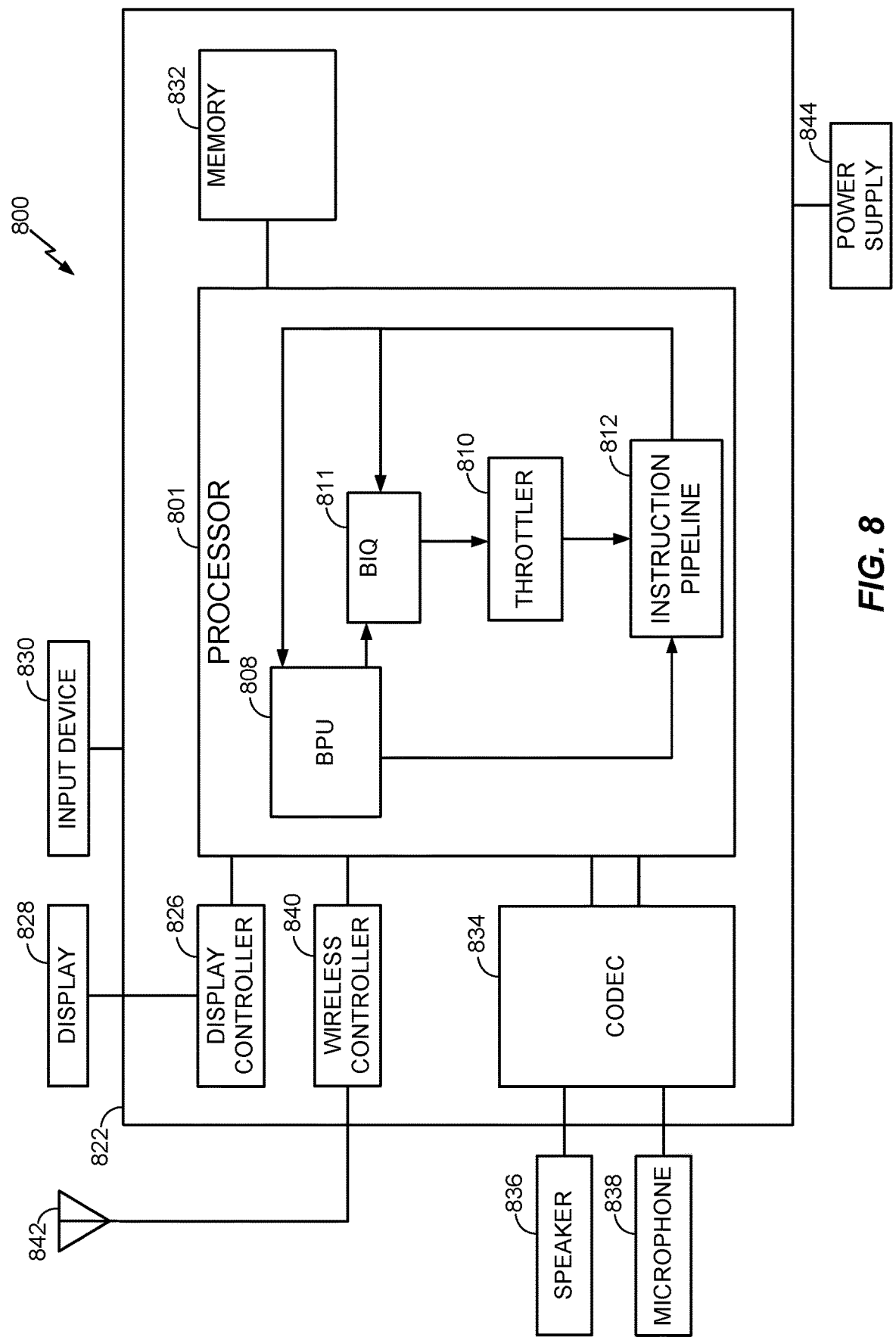
FIG. 8 illustrates an exemplary mobile device in accordance with some examples of the disclosure.

FIG. 8 illustrates an exemplary mobile device in accordance with some examples of the disclosure. Referring now to FIG. 8, a block diagram of a mobile device that is configured according to exemplary aspects is depicted and generally designated 800. In some aspects, mobile device 800 may be configured as a wireless communication device. As shown, mobile device 800 includes processor 801, which may be configured to implement the methods described herein in some aspects. Processor 801 is shown to comprise instruction pipeline 812, buffer processing unit (BPU) 808, branch instruction queue (BIQ) 811, and throttler 810 as is well known in the art. Other well-known details (e.g., counters, entries, confidence fields, weighted sum, comparator, etc.) of these blocks have been omitted from this view of processor 801 for the sake of clarity.

Processor 801 may be communicatively coupled to memory 832 over a link, which may be a die-to-die or chip-to-chip link. Mobile device 800 also include display 828 and display controller 826, with display controller 826 coupled to processor 801 and to display 828.

In some aspects, FIG. 8 may include coder/decoder (CODEC) 834 (e.g., an audio and/or voice CODEC) coupled to processor 801; speaker 836 and microphone 838 coupled to CODEC 834; and wireless controller 840 (which may include a modem) coupled to wireless antenna 842 and to processor 801.

In a particular aspect, where one or more of the above-mentioned blocks are present, processor 801, display controller 826, memory 832, CODEC 834, and wireless controller 840 can be included in a system-in-package or system-on-chip device 822. Input device 830 (e.g., physical or virtual keyboard), power supply 844 (e.g., battery), display 828, input device 830, speaker 836, microphone 838, wireless antenna 842, and power supply 844 may be external to system-on-chip device 822 and may be coupled to a component of system-on-chip device 822, such as an interface or a controller.

It should be noted that although FIG. 8 depicts a mobile device, processor 801 and memory 832 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 9:
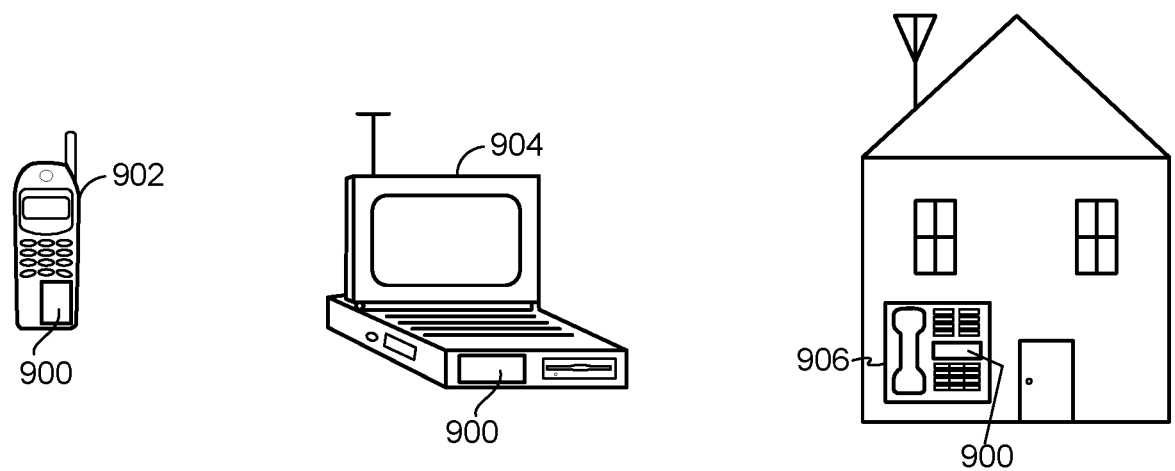
FIG. 9 illustrates various electronic devices that may be integrated with any of the aforementioned integrated devices in accordance with some examples of the disclosure.

FIG. 9 illustrates various electronic devices that may be integrated with any of the aforementioned integrated device, semiconductor device, integrated circuit, die, interposer, package or package-on-package (PoP) in accordance with some examples of the disclosure. For example, a mobile phone device 902, a laptop computer device 904, and a fixed location terminal device 906 may include an integrated device 900 as described herein. The integrated device 900 may be, for example, any of the integrated circuits, dies, integrated devices, integrated device packages, integrated circuit devices, device packages, integrated circuit (IC) packages, package-on-package devices described herein. The devices 902, 904, 906 illustrated in FIG. 9 are merely exemplary. Other electronic devices may also feature the integrated device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, an integrated device may comprise a first device layer (e.g., first device layer 110) comprising an active device and a first device bonding layer (e.g., first device bonding layer 120); a second device layer (e.g., second device layer 150) comprising a passive device and a second device bonding layer (e.g., second device bonding layer 140), the second device layer attached to the first device bonding layer; and means for shielding EM waves (e.g., shield 190), the means for shielding EM waves surrounding the active device comprising a plurality of bonding contacts in a first plane of the first device bonding layer, a plurality of bonding layer contact in a second plane parallel to the first plane, a plurality of bonding layer interconnects in the second plane, a plurality of vias in a third plane parallel to the second plane opposite the first plane, and a plurality of end of line interconnects in a fourth plane parallel to the third plane opposite the second plane, wherein the plurality of bonding layer interconnects couple at least one of the plurality of bonding layer interconnects to at least another one of the plurality of bonding layer interconnects and the plurality of end of line interconnects couple at least one of the plurality of vias to at least another one of the plurality of vias. It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature or function or incorporated in several components, processes, or functions. Additional elements, components, processes, and/or functions may also be added without departing from the disclosure. It should also be noted that FIGS. 1-9 and its corresponding description in the present disclosure is not limited to dies and/or ICs. In some implementations, FIGS. 1-9 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated device comprising:
   a first device layer comprising an active device and a first device bonding layer;
   a second device layer comprising a passive device and a second device bonding layer, the second device bonding layer attached to and in contact with the first device bonding layer; and
   a shield comprising
      a plurality of bonding contacts in a first plane of the first device bonding layer,
      a plurality of bonding layer contacts in a second plane parallel to the first plane,
      a plurality of bonding layer interconnects in the second plane,
      a plurality of vias in a third plane parallel to the second plane opposite the first plane, and
      a plurality of end of line interconnects in a fourth plane parallel to the third plane opposite the second plane,
   wherein the plurality of bonding layer interconnects couple at least one of the plurality of bonding layer contacts to at least another one of the plurality of bonding layer contacts and the plurality of end of line interconnects couple at least one of the plurality of vias to at least another one of the plurality of vias,
   wherein the shield is in between the active device and the passive device, and
   wherein the plurality of bonding contacts, the plurality of bonding layer contacts, the plurality of bonding layer interconnects, the plurality of vias, and the plurality of end of line interconnects are all formed within the first device bonding layer.

2. The integrated device of claim 1, wherein the shield is coupled to a ground.

3. The integrated device of claim 1, further comprising a plurality of I/O pins and a plurality of ground contacts at a first side of the first device layer, and
   wherein the first device bonding layer is at a second side of the first device layer opposite the first side of the first device layer.

4. The integrated device of claim 3, wherein the shield is coupled to at least one of the plurality of ground contacts.

5. The integrated device of claim 3, wherein the shield is configured to surround at least one of plurality of I/O pins at the first side of the first device layer.

6. The integrated device of claim 1, wherein the shield is configured to surround a top and one or more sides the active device.

7. The integrated device of claim 1, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

8. An integrated device comprising:
   a first device layer comprising an active device and a first device bonding layer;
   a second device layer comprising a passive device and a second device bonding layer, the second device bonding layer attached to and in contact with the first device bonding layer; and
   means for shielding electromagnetic (EM) waves comprising
      a plurality of bonding contacts in a first plane of the first device bonding layer,
      a plurality of bonding layer contacts in a second plane parallel to the first plane,
      a plurality of bonding layer interconnects in the second plane,
      a plurality of vias in a third plane parallel to the second plane opposite the first plane, and
      a plurality of end of line interconnects in a fourth plane parallel to the third plane opposite the second plane,
   wherein the plurality of bonding layer interconnects couple at least one of the plurality of bonding layer contacts to at least another one of the plurality of bonding layer contacts and the plurality of end of line interconnects couple at least one of the plurality of vias to at least another one of the plurality of vias,
   wherein the means for shielding EM waves is in between the active device and the passive device, and
   wherein the plurality of bonding contacts, the plurality of bonding layer contacts, the plurality of bonding layer interconnects, the plurality of vias, and the plurality of end of line interconnects are all formed within the first device bonding layer.

9. The integrated device of claim 8, wherein the means for shielding EM waves is coupled to a ground.

10. The integrated device of claim 9, further comprising a plurality of I/O pins and a plurality of ground contacts at a first side of the first device layer, and
wherein the first device bonding layer is at a second side of the first device layer opposite the first side of the first device layer.

11. The integrated device of claim 10, wherein the means for shielding EM waves is coupled to at least one of the plurality of ground contacts.

12. The integrated device of claim 10, wherein the means for shielding EM waves is configured to surround at least one of plurality of I/O pins at the first side of the first device layer.

13. The integrated device of claim 9, wherein the means for shielding EM waves is configured to surround a top and one or more sides the active device on at least three sides thereof.

14. The integrated device of claim 9, wherein the integrated device is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

15. A method for manufacturing an integrated device, the method comprising:
forming a first device substrate;
forming an active device in the first device substrate;
forming a shield;
forming a first device bonding layer on a first side of the first device substrate;
forming a second device substrate;
forming a passive device in the second device substrate;
forming a second device bonding layer on a first side of the second device substrate; and
bonding the first device bonding layer to the second device bonding layer,
wherein the second device bonding layer is attached to and in contact with the first device bonding layer,
wherein the shield is in between the active device and the passive device,
wherein forming the shield comprises:
forming a plurality of bonding contacts in a first plane of the first device bonding layer;
forming a plurality of bonding layer contacts in a second plane parallel to the first plane;
forming a plurality of bonding layer interconnects in the second plane;
forming a plurality of vias in a third plane parallel to the second plane opposite the first plane; and
forming a plurality of end of line interconnects in a fourth plane parallel to the third plane opposite the second plane,
wherein the plurality of bonding layer interconnects couple at least one of the plurality of bonding layer contacts to at least another one of the plurality of bonding layer contacts and the plurality of end of line interconnects couple at least one of the plurality of vias to at least another one of the plurality of vias, and
wherein the plurality of bonding contacts, the plurality of bonding layer contacts, the plurality of bonding layer interconnects, the plurality of vias, and the plurality of end of line interconnects are all formed within the first device bonding layer.

16. The method of claim 15, further comprising forming a plurality of I/O pins and a plurality of ground contacts at a first side of the first device layer, and
wherein the first device bonding layer is at a second side of the first device layer opposite the first side of the first device layer.

17. The method of claim 16, wherein the shield is coupled to at least one of the plurality of ground contacts.

18. The method of claim 16, wherein the shield is configured to surround at least one of plurality of I/O pins at the first side of the first device layer.

19. The method of claim 15, wherein the shield is configured to surround a top and one or more sides the active device.

* * * * *